(12) United States Patent
Griswold (10) Patent No.: US 7,558,414 B2
(45) Date of Patent: Jul. 7, 2009

(54) ITERATIVE IMAGE RECONSTRUCTION

(75) Inventor: Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 216 days.

(21) Appl. No.: 11/519,105

(22) Filed: Sep. 11, 2006

(65) Prior Publication Data

US 2008/0063247 A1   Mar. 13, 2008

(51) Int. Cl.
*G06K 9/00* (2006.01)
(52) U.S. Cl. .................. 382/128; 382/255; 382/131; 382/154; 382/280; 382/282; 378/4; 378/21; 378/22; 600/407; 600/410; 600/424; 324/309; 324/312
(58) Field of Classification Search .................. 382/128, 382/133, 255, 131, 154, 280, 282; 324/307–309, 324/312; 600/410, 407, 424
See application file for complete search history.

(56) References Cited

U.S. PATENT DOCUMENTS

| | | | | |
|---|---|---|---|---|
| 4,851,779 | A * | 7/1989 | DeMeester et al. | 324/312 |
| 6,249,595 | B1 * | 6/2001 | Foxall et al. | 382/128 |
| 6,560,353 | B1 * | 5/2003 | Haacke et al. | 382/128 |
| 7,202,663 | B2 * | 4/2007 | Huang | 324/307 |
| 7,301,342 | B2 * | 11/2007 | Moriguchi et al. | 324/309 |
| 7,429,860 | B2 * | 9/2008 | Taylor et al. | 324/307 |
| 2002/0014889 | A1 * | 2/2002 | Prussmann et al. | 324/307 |
| 2003/0179918 | A1 * | 9/2003 | Kohler | 382/131 |
| 2003/0203016 | A1 * | 10/2003 | Suwelack et al. | 424/449 |
| 2007/0156044 | A1 * | 7/2007 | Mistretta et al. | 600/410 |

OTHER PUBLICATIONS

Highly Constrained Backprojection for time resolved MRI, Mistretta et al, Jan. 2006.*
A note on the iterative MRI reconstruction from nonuniform k-space data, Knopp et al.*
Algebraic Reconstruction techniques can be made computationally efficient, Herman et al, IEEE 1993.*
Fast, iterative image reconstruction for mri in the presence of field inhomogeneities, IEEE 2003.*
Advances in sensitivity encoding with arbitrary k-space trajectories, Pruessmann et al ( 2001).*
Iterative tomographic image reconstruction using Fourier-based forward and back- projectors, IEEE Trans. Med. Imag., vol. 23, pp. 401-412, 2004.*

(Continued)

*Primary Examiner*—Vikkram Bali
*Assistant Examiner*—Nancy Bitar
(74) *Attorney, Agent, or Firm*—Kraguljac & Kalnay, LLC (57) ABSTRACT

Systems and methods using an image produced by a constrained image reconstruction process as a constraint in a forward iterative reconstruction process are described. One example system may include a constrained reconstruction logic to receive an initial data having an initial format and to produce an image data. The example system may include an iterative reconstruction logic that uses the image data as a constraint in a forward iterative step and that computes a correction factor based on comparing the image data to a reference data. The example system may include a deconstruction logic to deconstruct the image data into a deconstructed image data having the initial format and to selectively update the deconstructed image data based, at least in part, on the correction factor.

11 Claims, 7 Drawing Sheets

OTHER PUBLICATIONS

Sutton et al (Fast, Iterative image reconstruction for MRI in the presense of field inhomogeneities , IEEE 2003).*

1.7 Mere Optimal HYPR Reconstructions Using a Combination of HYPI~ and Conjugate-Gradient Minimization,2006.*

The Iterated Normalized Backprojection Method of Image Reconstruction, Nowinski et al, 2003.*

Knopp et al., A note on the Iterative MRI Reconstruction from Nonuniform K-Space Data, pp. 1-15, Preprinted in 2005 on http://www-user.tu-chemnitz.de/~potts/publikationen.php.

Desplanques et al., Iterative Reconstruction of Magnetic Resonance Images from Arbitrary . . . , 2002 IEEE, pp. 1695-1699, Dept. of Elec. and Info. Sys., Ghent Univ, Ghent, Belg.

Pruessmann et al., Advances in Sensitivity Encoding With Arbitrary k-Space Trajectories, 2001, Magnetic Resonance in Medicine 46:638-651, Wiley-Liss Inc.

Mistretta et al., Highly Constrained Backprojection for Time-Resolved MRI, Magnetic Resonance in Medicine 55:30-40 (2005), Wiley-Liss Inc.

Noll et al., Conjugate Phase MRI Reconstruction With Spatially Variant . . . , IEEE Transactions on Medical Imaging, vol. 24, No. 3, Mar. 2005, pp. 325-336.

Barmet et al., Efficient Iterative Reconstruction for MRI in . . . , Proc. Intl. Soc. Mag. Reson. Med. 11 (2004) Institute for Biomedical Eng., ETH Zurich, Switzerland, pp. 347.

PCT International Search Report and Written Opinion of the International Searching Authority having a date of mailing of Aug. 25, 2008 in co-pending PCT International Patent Application No. PCT/US07/07047 having an International Filing Date of Mar. 21, 2007 and the applicant of Case Western Reserve University, and entitled: Interactive Image Reconstruction.

* cited by examiner

ITERATIVE IMAGE RECONSTRUCTION

TECHNICAL FIELD

The systems, methods, computer-readable media and so on described herein relate generally to the magnetic resonance imaging (MRI) arts. They find particular application to image reconstruction.

BACKGROUND

A goal of magnetic resonance imaging (MRI) is to image the spatial distribution of the transverse magnetization of an object. To do this, the local properties at a point r may be examined. Point r may be isolated in a main magnetic field $B_0$ using gradient magnets. Spins in the object may be excited with a radio frequency (RF) pulse, causing them to enter a higher energy state and then to precess at a known frequency (f) while they release excess energy in returning to their low energy state. This excess energy can be received by an RF receive coil(s). RF receive coils may be spatially non-selective and thus may integrate over an entire volume. The received signal S(t) may be represented by:

$$S(t) = \int_x Mxy(x) e^{-i2\pi k(t)x} dx$$

where S(t) is the sum of all the signals produced by all the points releasing their energy. However, the local properties at each point r may be of interest. Complicating processing is the fact that data describing local properties for one point may be influenced by data from other points. Looking at the local properties for a point may include sampling the spatial frequency content of an image and then reconstructing an image. Comparing the received data with a reconstructed image facilitates determining how correctly (e.g., accurately) the reconstruction process worked. While MR imaging is described, similar issues may exist with other imaging methods (e.g., computed tomography (CT), positron emission tomography (PET), single photon emission computed tomography (SPECT)).

Image reconstruction is the process of transforming raw data into a spatial image where the spatial image faithfully represents the object from which the raw data was received. Image reconstruction may be viewed as an inverse problem that involves identifying the input to a system based on knowledge about the output of the system. Regularization involves incorporating some expected properties of the input into the calculations for identifying the input. Generally, MR image reconstruction can be seen as a problem involving solving for an image I(x) given a k-space signal s(k), where:

$$S(k) = \int_{-\infty}^{+\infty} I(x) e^{-i2\pi k \Delta k x} dx$$

where $-N <= k <= N$.

If a full k-space was sampled, then there would be a one-to-one relationship between a signal domain and a frequency domain. However, it may be impractical to acquire a full k-space sample. Instead, partial acquisitions may be acquired. Partial acquisitions may also occur in other imaging methods. With partial acquisitions, a theoretically infinite number of images may match the collected k-space sample. Furthermore, the reconstructed image may include artifacts related to under sampling. So, a challenge is to make a good image I(x) with a signal S(k) that represents less than all the available signal where the signal S(k) may be noisy, and to do so in a timely manner.

A technique to improve reconstructed images involves "filling in" the missing data of a partial k-space. Various techniques may be used to provide the missing data. For example, missing locations may be zero-filled where a zero is entered into locations for which no k-space signal is provided. This is generally unsatisfactory. Other techniques may include, for example, conjugate synthesis, Margosian direct method, homodyne demodulation, Cupper's iterative method, iterative projection onto convex sets (POCS), singular value decomposition, and so on. Iterative methods have also been employed with various amounts of success in various contexts. However, these and indeed most reconstruction methods that reconstruct from a partial k-space may suffer from artifacts related to the under-sampling.

Thus, reconstruction methods that attempt to correct for artifacts are of interest. These methods are concerned with finding a "corrected image" that faithfully represents the object being imaged. In these approaches, an image forming process can be seen to be a linear transformation between an ideal image I(x,y) that would perfectly represent the object from which the k-space signal was received and the measured k-space signal S(k,l), where, for example:

$$S(k, l) = \sum_{z=0}^{M-1} \sum_{y=0}^{N-1} I(x, y) A(x, y, k, l)$$

where A(x,y,k,l) depends on $\Delta B_0$, the changing $B_0$ field.

Transforming this equation into a relation between a Fourier transformed reconstructed image I'(x',y') and the ideal image I(x,y) yields:

$$I'(x', y') = \sum_{x=0}^{M-1} \sum_{y=0}^{N-1} I(x, y) K(x, y, x', y')$$

where K(x,y,x',y') depends on an inverse Fourier transform of A.

It follows therefore that finding a corrected image involves solving a linear system of equations. There are different methods for solving linear systems of equations. Methods include, for example, conjugate gradient (CG), steepest descent (SD), and so on. Thus, one approach to reconstruction can be seen as solving:

I'n=KnIn, where I(x,y) is an ideal image, I'(x',y') is a reconstructed image, and K is a matrix that represents a measure of the geometric distortion of an image.

This can be seen as a linear equation system of the general type:

Ax=b which are well solved using the CG method.

Using the CG method, one can attempt to minimize:

$F(x) = 1/2 x^T A x - b^T x$ to eliminate error $e = Ax - b$.

By letting A=K, b=I' and x=I, the CG method can be used to solve the normal equation:

$K^H KI = K^H I'$.

The following steps, which represent one example CG method, can be used to solve for $K^H KI = K^H I'$.

Establish initial solution $I_0$ as distorted image I'
Compute first residual $r_0 = I' - KI_0$
Compute first direction $\rho_0 = Kr_0$
repeat
    Compute $C_m = \|K^H r_m\|_2^2$
    Compute $D_m = \|K\rho_m\|_2^2$
    Compute $a_m = c_m / d_m$
    Update solution $I_{m+1} = I_m + a_m \rho_m$
    Update residual $r_{m+1} = r_m - a_m K\rho_m$
    Compute $C_m = \|K^H r_{m+1}\|_2^2 / C_m$
    update direction $\rho_{m+1} = K^H r_{m+1} + c_m \rho_m$
    m=m+1
until termination condition is met.

The above method generally describes how an iterative process (e.g., CG) may proceed during image reconstruction. Note that the forward iteration step is unconstrained.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements, that multiple elements may be designed as one element, that an element shown as an internal component of another element may be implemented as an external component and vice versa, and so on. Furthermore, elements may not be drawn to scale.

Prior Art

Prior Art

DETAILED DESCRIPTION

The method presented in the background generally describes how an iterative process (e.g., CG) may proceed during image reconstruction. Note that the forward iteration step is unconstrained. Example systems and methods described herein include a constraint on the forward iteration step. In one example, an image produced by a highly constrained projection reconstruction (HYPR) may operate as a constraint on a forward iteration step in an iterative solution to image reconstruction.

Constrained projection reconstruction methods do not expect to receive signal from all possible locations. By only looking for, accepting, and processing signal from certain locations, relatively artifact free images may be reconstructed, even in the face of significant under sampling of data containing varying time courses in neighboring locations. These certain locations may be related, for example, to an image produced using HYPR. The nature of the constraint may dictate how artifact free an image may be made. Conventional constrained reconstructions may disregard inconsistencies between raw data and an image reconstructed from that raw data. Conversely, example methods identify inconsistencies between reference data (e.g., raw data, partially corrected data), and an image reconstructed from that data. Upon identifying an inconsistency, example methods may attempt to improve a constraining image (e.g., composite) and/or may attempt to improve correction data that facilitates relating reference data to a reconstructed image. The improvements may be generated, for example, by using a conjugate gradient (CG) method, a steepest descent (SD) method, and so on.

A general flow for one example method is described below:

Acquire single sets of raw data
Make a composite from the raw data (or establish another constraint)
Establish a reference data set
Reconstruct composite image using a constrained reconstruction method
Repeat
{
    Identify differences between reference data and reconstructed image
    Determine correction factor relating the reconstructed image
    and the raw data
    Update reference data
    Reconstruct composite image using reference data and
    correction factor
}
Until (termination conditions are met)

While this method describes identifying differences between reference data and a reconstructed image, it is to be appreciated that other approaches may be taken. For example, differences between a raw data and a reconstructed image may be made. The reference data may be, for example, the results of an earlier iteration through the repeat/until loop.

HYPR facilitates accelerating magnetic resonance (MR) acquisitions and thus has been used in applications including MR angiography. In HYPR, a composite is created from a set of individual frames. The composite contains the possible locations for an MR signal. By limiting processing to the locations from which signals are known to have been received, better image quality can be obtained in a shorter acquisition time. Acquiring less than all the normally required data may be referred to as under sampling. Under sampling typically leads to artifacts (e.g., streaking artifacts). By constraining the locations from which signals are processed, these artifacts may be lessened over conventional systems.

A reconstructed image may be created from a composite frame. Using HYPR, the signal to noise ratio (SNR) in the reconstructed image will depend more on the signal in the composite frame than on the signal in an individual time frame. This facilitates mitigating issues associated with SNR per unit time limits.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, and volatile media. Common forms of a computer-readable medium include, but are not limited to, a floppy disk, a herd disk, a magnetic tape, a CD-ROM, other optical media, a RAM, a memory chip or card, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. A logic may take forms including a software controlled microprocessor, a discrete logic like an application specific integrated circuit (ASIC), a programmed logic device, a memory device containing instructions, and so on. A logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically and/or statically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein may be produced using programming languages and tools like Java, C++, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded to a user. In another example, the computer-readable medium has a form of the software/firmware as it is maintained on the server.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

Figure 1:
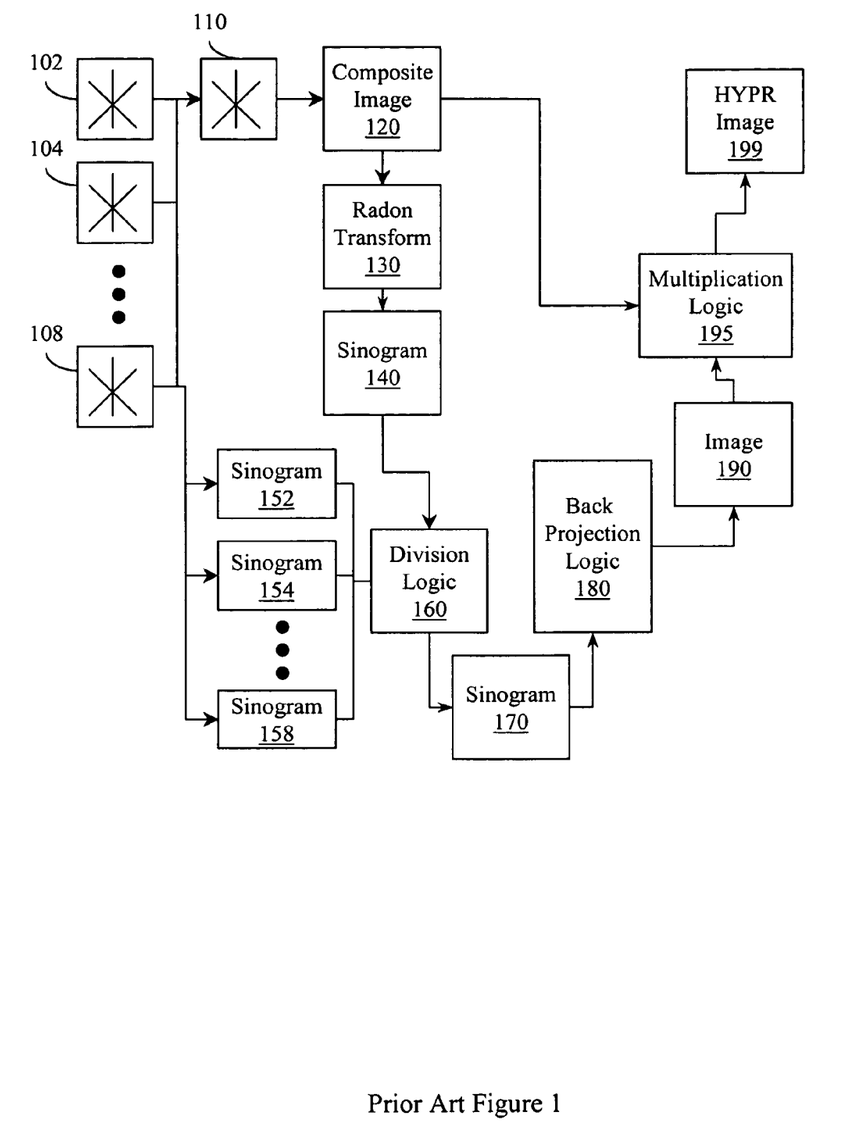
FIG. 1 illustrates processing and data associated with a conventional highly constrained projection reconstruction (HYPR) process.
Figure 2:
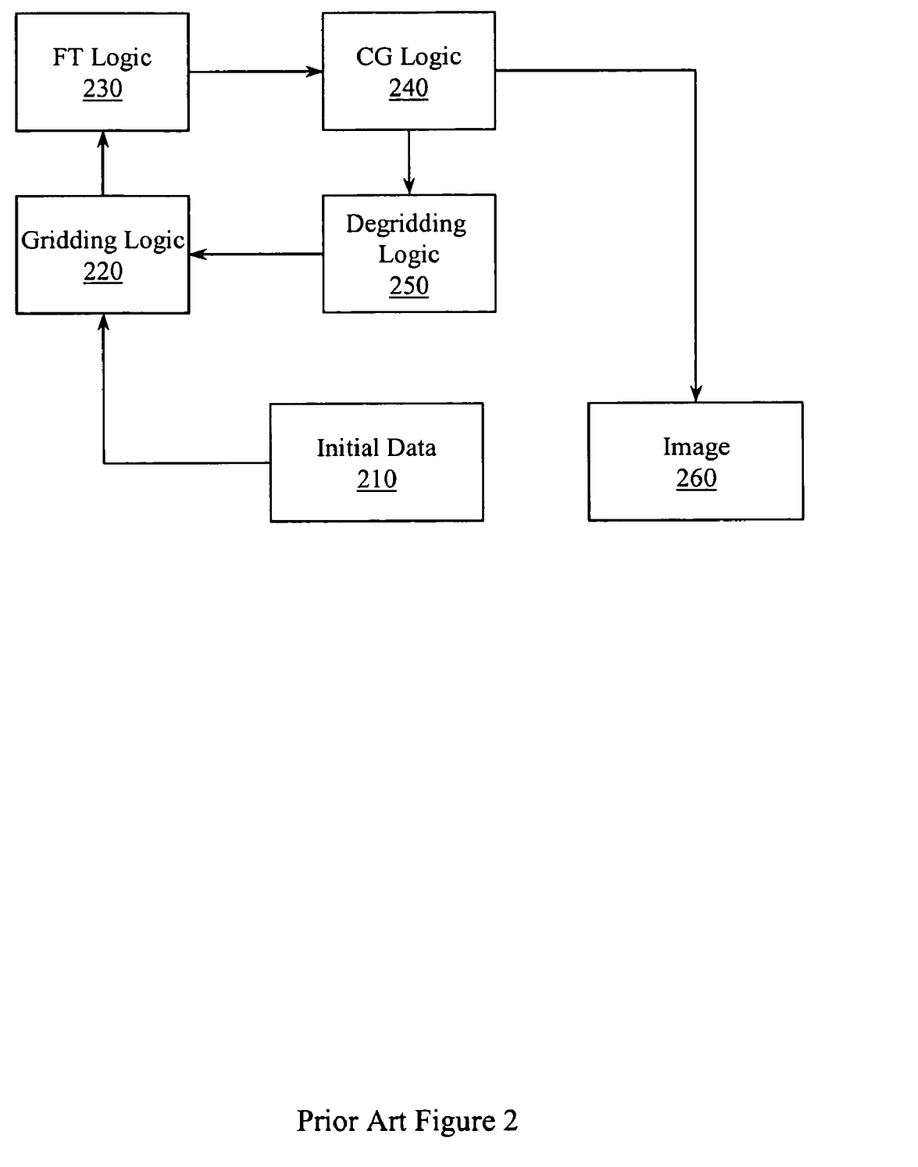
FIG. 2 illustrates processing and data associated with a conventional conjugate gradient (CG) image reconstruction process.

Conventional methods may be better appreciated with reference to the processing and data flow diagrams of Prior Art FIGS. 1 and 2. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

Prior Art FIG. 1 illustrates processing and data associated with a conventional HYPR reconstruction process. The resulting HYPR image 199 may be used as a constraint in an iterative reconstruction process (e.g., CG, SD). For example, HYPR image 199 may be used to control locations from which signal is accepted. At times $t_0, t_1, \ldots t_n$, multiple interleaves (e.g., frames 102, 104, ... 108) are acquired. These frames can be combined into a composite frame 110 from which a composite image 120 can be constructed. Neither frame 110 nor image 120 will have temporal resolution.

Composite image 120 may be projected into a radially sampled plane using, for example, a Radon transform logic 130 to produce a sinogram 140 for the composite image 120. A sinogram (e.g., 152, 154, ... 158) associated with an individual frame (e.g., 102, 104, ... 108) may then be divided by the sinogram 140 for the composite image using, for example, a sinogram division logic 160. The resulting data (e.g., divided out sinogram 170) may then be back projected without filtering into the image domain using, for example, a back projection logic 180 to create an individual frame image 190. Individual frame image 190 may then be multiplied by composite image 120 using, for example, a frame/image multiplication logic 195 to produce a final reconstructed image 199.

From the processing performed in association with Prior Art FIG. 1 it can be seen that individual frames (e.g., 102, 104, ... 108) can be considered to be weightings of composite image 120. The weighting concept facilitates exploiting the sparseness of an image to allow significant under sampling of an image. The conventional HYPR processing illustrated in Prior Art FIG. 1 performs well when differing time signal time courses occur at widely separated areas of an image. This is the result of the intrinsically low spatial resolution of a weighting factor image. However, when differing time signal time courses occur closely together, (e.g., neighboring veins and arteries) HYPR reconstruction may provide less than desired results.

This application describes a modification to an iterative reconstruction process. The modification appears by viewing a constrained reconstruction not as a complete reconstruction itself but rather as a correctable constraint for an iterative image reconstruction process. By way of illustration, HYPR image 199 may be used as a constraint in a forward iteration step in a CG method of image reconstruction. By way of further illustration, HYPR image 199 may be used as a constraint in a step in a SD method of image reconstruction (see, for example, FIG. 6). In these image reconstruction methods, the HYPR image 199 may be used as a nearly optimal constraint that allows the iterative methods to converge more quickly than unconstrained iterative methods.

Prior Art FIG. 2 illustrates processing and data associated with a conventional CG reconstruction method. Initial data 210 may be provided to a gridding logic 220 that places the initial data 210 into desired (e.g., correct) locations in a raw data domain to produce a gridded raw data domain data. In some examples, gridding logic 220 may also fill in data missing due to a partial acquisition. The gridded raw data domain data may be provided to a fast Fourier transform (FFT) logic 230. The FFT logic 230 performs an FFT on the gridded raw data domain data and provides the transformed data to a CG logic 240. CG logic 240 may then compare a first data set (e.g., initial data 210) to the transformed data to determine a correction factor to apply to improve (e.g., optimize) agreement between the first data set and the transformed data.

The image data may then be deconstructed (e.g., Radon transformed, degridded) by, for example, a degridding logic 250 to produce a deconstructed data. The deconstructed data may then be updated based, for example, on the correction factor. This deconstructed data may then be provided to the gridding logic 220 to begin another cycle. Processing may continue until, for example, CG logic 240 determines not to provide an additional correction factor. By way of illustration, the CG logic 240 may determine that the process has converged, that a pre-determined configurable number of iterations has occurred, and so on. CG logic 240 may produce an image 260. Image 260 may be updated, for example, on each iteration through the processing illustrated in Prior Art FIG. 2.

Figure 3:
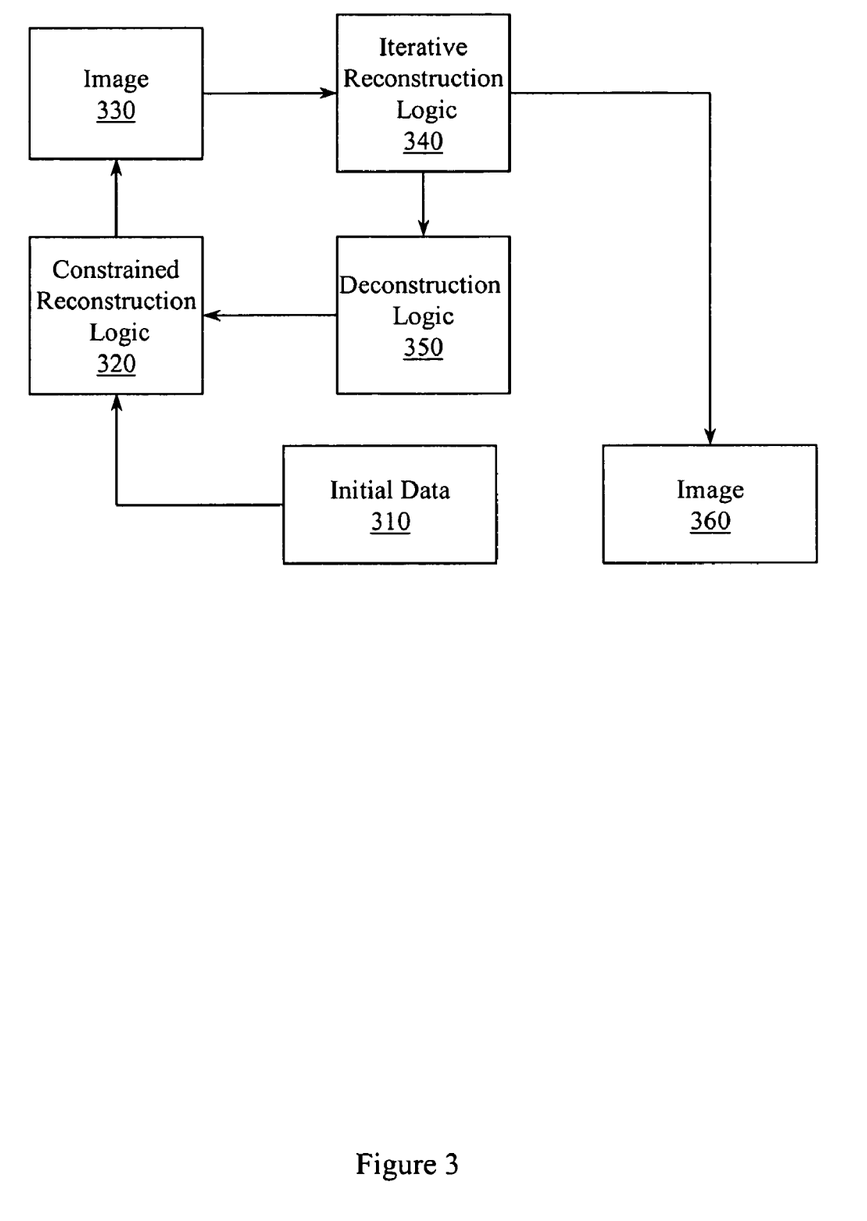
FIG. 3 illustrates processing and data associated with an iterative image reconstruction that employs the output of a constrained reconstruction as a constraint in a forward iterative step.

FIG. 3 illustrates processing and data associated with a reconstruction method (e.g., CG) that uses the result of a constrained reconstruction (e.g., HYPR) as a constraint in the forward processing steps. In one example, initial data 310 is provided to a constrained reconstruction logic 320 (e.g., HYPR reconstruction logic) to produce a reconstructed image 330 (e.g., HYPR reconstructed image). Initial data 310 may be received from, for example, an MR apparatus, a CT apparatus, a PET apparatus, a SPECT apparatus, and so on. While a HYPR reconstruction logic 320 is described, it is to be appreciated that other constrained reconstruction logics may be employed. In one example, initial data 310 may include sets of data received from individual receivers and kept separate. In another example, initial data 310 may include sets of data received from individual receivers and combined into a single combined set of signal.

The image 330 may include artifactual signal in some locations if, for example, the raw data 310 included closely spaced pixels with differing signal time courses. Image 330 may be provided to an iterative reconstruction logic 340 (e.g., CG logic) that will recognize locations in which artifactual signal appears. The iterative reconstruction logic 340 may recognize the locations as, for example, locations where reconstructed image 330 differs from a reference data set (e.g., initial data 310). Rather than simply accepting or ignoring the artifact as conventional systems would do, the iterative reconstruction logic 340 may produce a correction factor to attempt to reduce the difference.

Thus, the image data may then be deconstructed (e.g., radon transformed, degridded) by, for example, a deconstruction logic 350 (e.g., degridding logic) to produce a deconstructed data. This deconstructed data may be corrected based, for example, on the correction factor. This corrected data may then be provided to the constrained reconstruction logic 320 to begin another cycle. Processing may continue until, for example, CG logic 340 determines that the process has converged. CG logic 340 may also provide an image 360. Image 360 may be updated, for example, on each iteration through the processing illustrated in FIG. 3.

Unlike conventional HYPR processing, the processing illustrated in FIG. 3 facilitates reconstructing accurate (e.g., artifact free and not temporally blurred) images even when neighboring pixels have differing signal time courses. Furthermore, conventional HYPR reconstruction may require user provided inputs based on a-priori knowledge of a desired image. The example systems and methods described herein require no similar user input. Additionally, a composite image can be more simply defined because even projections including narrowly separated time courses can be employed to generate a composite, not just those with widely separated time courses. Thus, CG logic 340 can correct residual artifacts due to the non-ideal composite used by the HYPR logic 320 as it performs a HYPR reconstruction. The processing illustrated in FIG. 3 may yield a SNR less than a pure HYPR method, however, it will also produce a temporal resolution much greater than from the pure HYPR method. Thus, this processing may be valuable in, for example, real time cardiac imaging.

While FIG. 3 illustrates various actions occurring in serial, it is to be appreciated that various actions illustrated in FIG. 3 could occur substantially in parallel. By way of illustration, a first process could perform constrained reconstruction (e.g., HYPR) while a second process could perform an iterative reconstruction process (e.g., CG, SD), and a third process could deconstruct data (e.g., degrid). While three processes are described, it is to be appreciated that a greater and/or lesser number of processes could be employed and that lightweight processes, regular processes, threads, and other approaches could be employed. It is to be appreciated that other example methods may, in some cases, also include actions that occur substantially in parallel.

Figure 4:
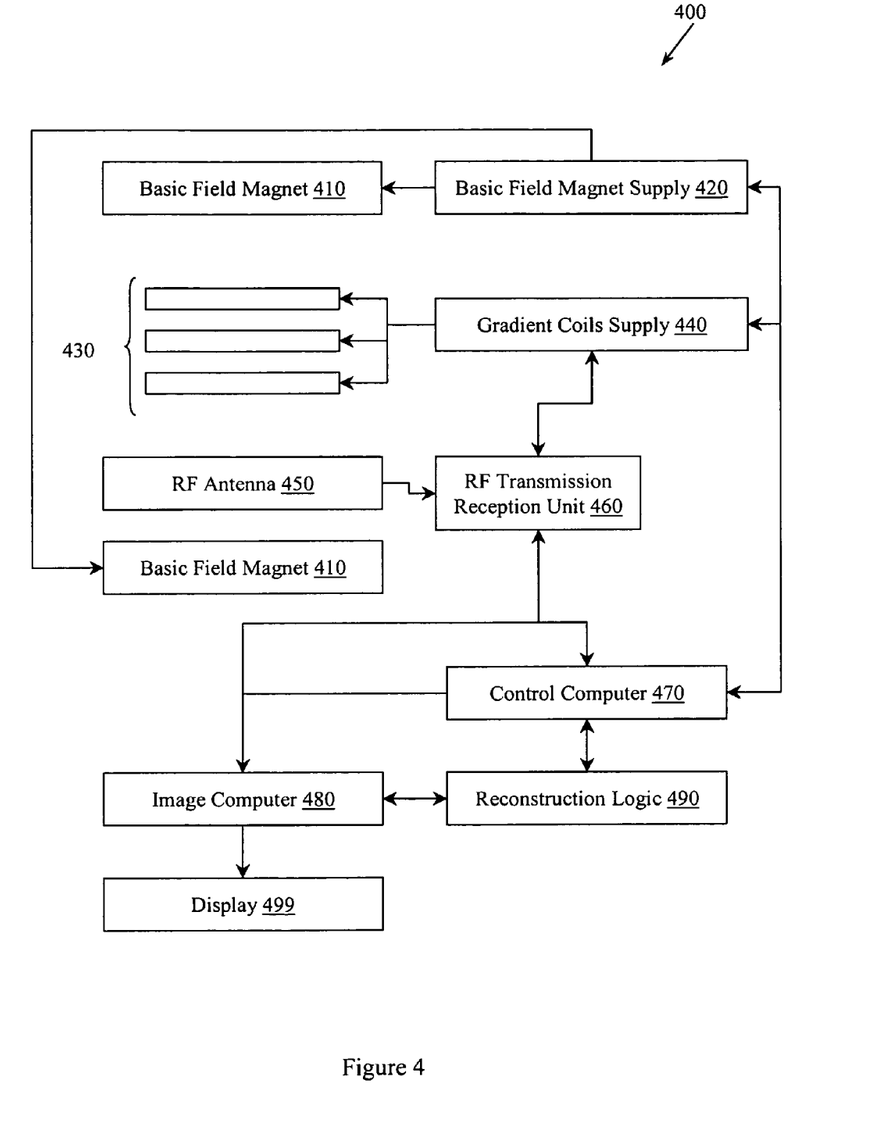
FIG. 4 illustrates an example MRI apparatus configured with a reconstruction logic.

FIG. 4 illustrates an example MRI apparatus 400 configured to produce an MR image of an object. Apparatus 400 may be one of many different types of MRI apparatus, for example, a Siemens 1.5T Sonata imager. Apparatus 400 includes a basic field magnet(s) 410 and a basic field magnet supply 420. Ideally, the basic field magnets 410 would produce a uniform $B_0$ field. However, in practice, the $B_0$ field may not be uniform, and may vary over an object being imaged by the MRI apparatus 400. MRI apparatus 400 may include gradient coils 430 configured to emit gradient magnetic fields like $G_S$, $G_P$ and $G_R$. The gradient coils 430 may be controlled, at least in part, by a gradient coils supply 440.

MRI apparatus 400 may also include an RF antenna(s) 450 that is configured to generate RF pulses and to receive resulting magnetic resonance signals from an object to which the RF pulses are directed. In one example, separate RF transmission and reception coils can be employed. The RF antenna 450 may be controlled, at least in part, by an RF transmission-reception unit 460. The gradient coils supply 440 and the RF transmission-reception unit 460 may be controlled, at least in part, by a control computer 470. In one example, the control computer 470 may be programmed to perform methods like those described herein and/or to control a reconstruction logic 490 to perform methods like those described herein. In one example, the MRI apparatus 400 may include multiple signal receivers (e.g., antennas, coils). Thus, in one example, reconstruction logic 490 may perform a set of constrained reconstructions on signal received from individual receivers. In another example, reconstruction logic 490 may perform a constrained reconstruction on combined signal received from two or more receivers.

The MR signals received from the RF antenna 450 can be employed to generate an image, and thus may be subject to a transformation process like a two dimensional FFT that generates pixilated image data. The transformation can be performed by an image computer 480 or other similar processing device. In one example, image computer 480 may be programmed to perform methods like those described herein and/or to control reconstruction logic 490 to perform methods like those described herein. The image data may then be shown on a display 499.

While FIG. 4 illustrates an example MRI apparatus 400 that includes various components connected in various ways, it is to be appreciated that other MRI apparatus may include other components connected in other ways. In one example, to implement example systems and methods described herein, MRI apparatus 400 may be configured with a reconstruction logic 490. In different examples, reconstruction logic 490 may be permanently and/or removably attached to an MRI apparatus. While reconstruction logic 490 is illustrated as a single logic connected to control computer 470 and image computer 480, it is to be appreciated that reconstruction logic 490 may be distributed between and/or operably connected to other elements of apparatus 400. Reconstruction logic 490 may be configured to receive raw data and to perform a constrained reconstruction method (e.g., HYPR) to produce an image that can be used as a constraint in a forward iterative reconstruction process.

Figure 5:
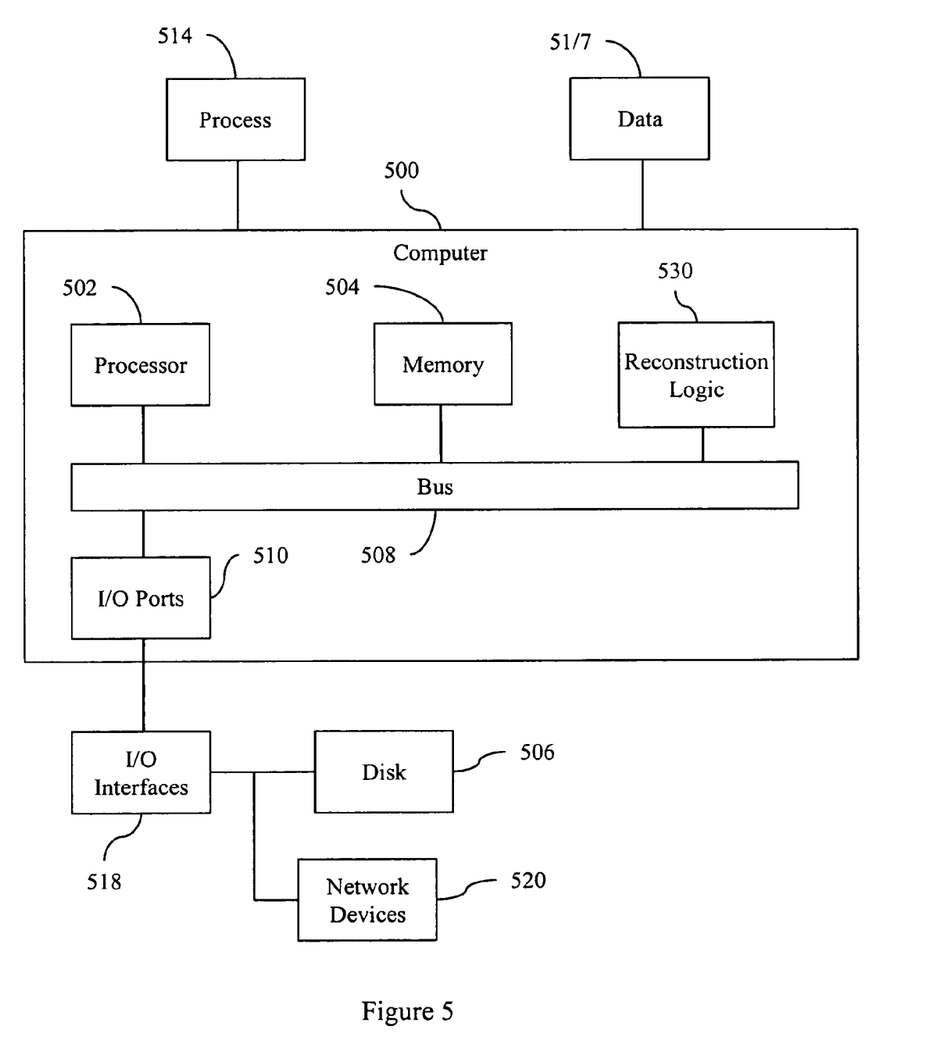
FIG. 5 illustrates an example computer in which example systems and methods illustrated herein can operate, the computer being operably connectable to an MRI apparatus.

FIG. 5 illustrates an example computer 500 in which example methods illustrated herein can operate and in which example reconstruction logics may be implemented. In different examples computer 500 may be part of an MRI apparatus or may be operably connectable to an MRI apparatus.

Computer 500 includes a processor 502, a memory 504, and input/output ports 510 operably connected by a bus 508. In one example, computer 500 may include a reconstruction logic 530 that is configured to perform an iterative reconstruction method that uses an image produced by a constrained reconstruction method as a constraint in a forward iterative step in a reconstruction. Thus, reconstruction logic 530, whether implemented in computer 500 as hardware, firmware, software, and/or a combination thereof may provide means (e.g., hardware, software) for receiving MR data, means (e.g., hardware, software) for performing a HYPR reconstruction on MR data, and means (e.g., hardware, software) for performing an iterative reconstruction using a result of the HYPR reconstruction as a constraint in a forward iterative step. In different examples, reconstruction logic 530 may be permanently and/or removably attached to computer 500.

Processor 502 can be a variety of various processors including dual microprocessor and other multi-processor architectures. Memory 504 can include volatile memory and/or non-volatile memory. A disk 506 may be operably connected to computer 500 via, for example, an input/output interface (e.g., card, device) 518 and an input/output port 510. Disk 506 can include, but is not limited to, devices like a magnetic disk drive, a tape drive, a Zip drive, a flash memory card, and/or a memory stick. Furthermore, disk 506 may include optical drives like a CD-ROM and/or a digital video ROM drive (DVD ROM). Memory 504 can store processes 514 and/or data 516, for example. Disk 506 and/or memory 504 can store an operating system that controls and allocates resources of computer 500.

Bus 508 can be a single internal bus interconnect architecture and/or other bus or mesh architectures. While a single bus is illustrated, it is to be appreciated that computer 500 may communicate with various devices, logics, and peripherals using other busses that are not illustrated (e.g., PCIE, SATA, Infiniband, 1394, USB, Ethernet).

Computer 500 may interact with input/output devices via i/o interfaces 518 and input/output ports 510. Input/output devices can include, but are not limited to, a keyboard, a microphone, a pointing and selection device, cameras, video cards, displays, disk 506, network devices 520, and the like. Input/output ports 510 can include but are not limited to, serial ports, parallel ports, and USB ports.

Computer 500 may operate in a network environment and thus may be connected to network devices 520 via i/o interfaces 518, and/or i/o ports 510. Through the network devices 520, computer 500 may interact with a network. In one example, computer 500 may be connected through a network to the MRI apparatus whose acquisition parameters may be dynamically adapted. Through the network, computer 500 may be logically connected to remote computers. The networks with which computer 500 may interact include, but are not limited to, a local area network (LAN), a wide area network (WAN), and other networks.

Figure 6:
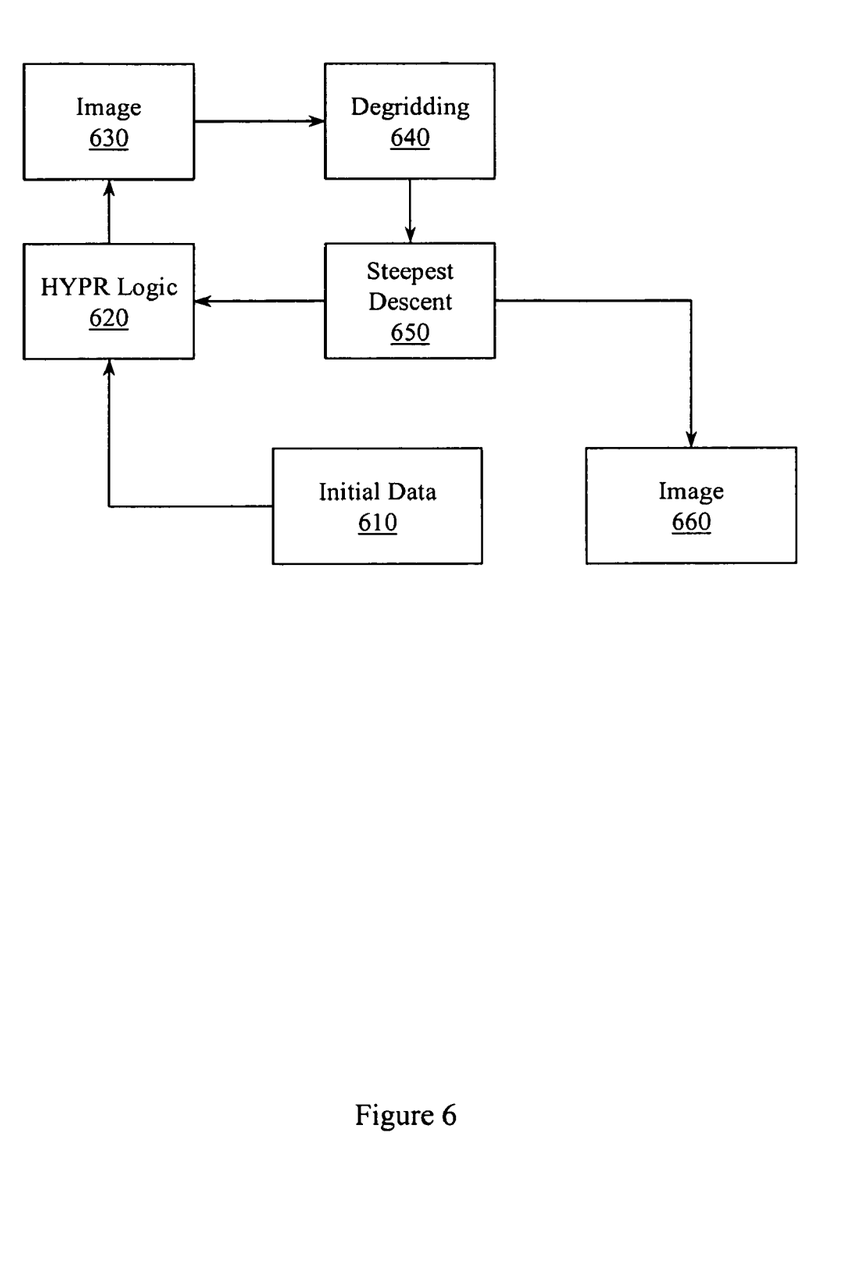
FIG. 6 illustrates processing and data associated with an iterative image reconstruction that employs the output of a constrained reconstruction as a constraint in a forward iterative step.

FIG. 6 illustrates processing and data associated with an iterative image reconstruction that employs the output of a constrained reconstruction as a constraint in a forward iterative step. An initial data 610 may be provided to a HYPR logic 620 that produces an image 630. Image 630 may then be provided to a degridding logic 640 that provides a deconstructed data to a steepest descent logic 650. Steepest descent logic 650 may provide an image 660, which may be updated on each iteration through the image reconstruction process. Steepest descent logic 650 may also compute a correction factor that is used to selectively manipulate a reference data that is then provided for another iteration through the HYPR and SD process.

Figure 7:
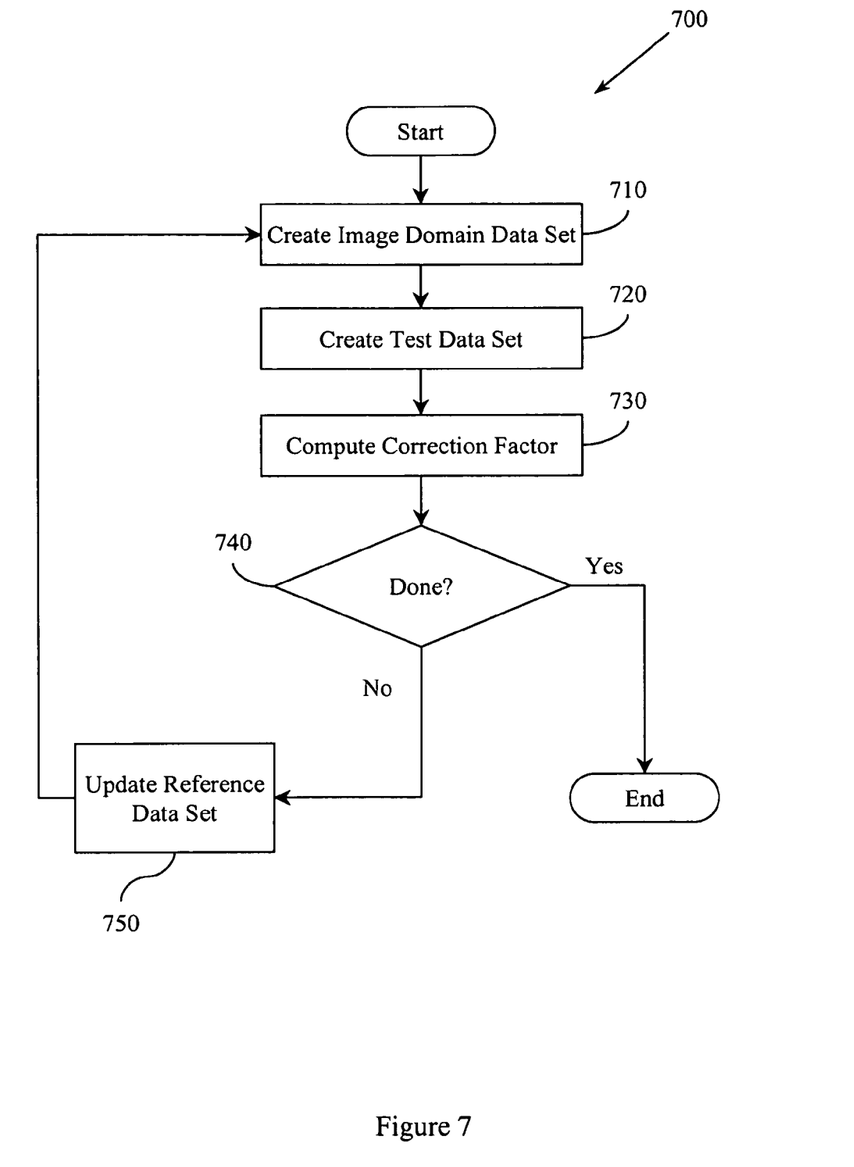
FIG. 7 illustrates a method associated with an iterative image reconstruction that employs the output of a constrained reconstruction as a constraint in a forward iterative step.

Example methods may be better appreciated with reference to the processing and data flow diagrams of FIG. 7. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

FIG. 7 illustrates a method 700 associated with an iterative image reconstruction that employs the output of a constrained reconstruction as a constraint in a forward iterative step. Method 700 may include, at 710, creating an image domain data set from a reference data set. The reference data set may be received, for example, from a magnetic resonance (MR) apparatus, a computed tomography (CT) apparatus, a positron emission tomography (PET) apparatus, and a single photon emission computed tomography (SPECT) apparatus. The reference data set may be, for example, a spatial frequency domain data set collected from an MR apparatus. In one example, the reference data set may be a set of signal sets received from a set of receivers where the signal sets are combined into a single set of signals. In another example, the reference data set may be a set of signals received from a set of receivers and kept separately on a per receiver basis.

Method 700 may include, at 720, creating a test data set from the image domain data set. Creating the test data set may include, for example, performing a constrained projection reconstruction method. In different examples, creating the test data set may also include performing an iterative reconstruction process (e.g., CG, SD).

Method 700 may also include, at 730, computing a correction factor based, for example, on a difference between the test data set and the reference data set. For example, raw spatial frequency domain data may be compared to deconstructed image data to determine how accurately a construction/deconstruction process performed.

A determination may be made at 740. For example, termination conditions including a convergence factor, an iteration count, and so on may be examined. If the determination is that method 700 should complete, then processing may conclude.

However, if the determination at 740 is that processing should continue, then the reference data set may be updated at 750. The reference data set may be updated based, at least in part, on the correction factor computed at 730. Processing may then return to 710 where another iteration through the iterative method may begin.

In one example, methodologies are implemented as processor executable instructions and/or operations provided on a computer-readable medium. Thus, in one example, a computer-readable medium may store processor executable instructions operable to perform a method including creating an image domain data set from a reference data set, creating a test data set from the image domain data set, computing a correction factor based on a difference between the reference data set and the test data set, and selectively updating the reference data set based on the correction factor and repeating these actions until a termination condition has been satisfied. While this method is described being provided on a computer-readable medium, it is to be appreciated that other example methods described herein may also be provided on a computer-readable medium.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
   a constrained reconstruction logic configured to receive an initial data having an initial format, to establish a reference data from the initial data, and to produce an image data from the reference data, where the reference data is one or more of, a composite of two or more undersampled data sets, and a separately acquired reference data set;
   an iterative reconstruction logic configured to use the image data as a constraint in a forward iterative process having a plurality of forward iterative steps and to compute a correction factor based on comparing the image data to the reference data to identify a location where the image data differs from the reference data; and
   a deconstruction logic configured to deconstruct the image into a deconstructed data having the initial format and to selectively update the reference data in a member of the plurality of forward iterative steps based, at least in part, on the correction factor and the deconstructed data, where the correction factor facilitates resolving a difference between the image data and the reference data;

where the constrained reconstruction logic, the iterative reconstruction logic, and the deconstruction logic are embodied on a computer-readable storage medium.

2. The system of claim 1, where the iterative reconstruction logic performs a conjugate gradient reconstruction.

3. The system of claim 1, where the iterative reconstruction logic performs a steepest descent reconstruction.

4. The system of claim 1, the initial data being a spatial frequency data.

5. The system of claim 1, the initial data being received from one of, a magnetic resonance imaging (MRI) apparatus, a positron emission tomography (PET) apparatus, a computed tomography (CT) apparatus, and a single positron emission computed tomography (SPECT) apparatus.

6. An iterative reconstruction method performed by a processor associated with an MRI apparatus, the method comprising:

repetitively, in a forward iterative process having a plurality of forward iterative steps, creating an image domain data set from a reference data set, where creating the image domain data set includes performing a highly constrained projection reconstruction process, where the reference data is one or more of, a composite of two or more under-sampled data sets, and a separately acquired reference data set;

creating a test data set from the image domain data set;

computing a correction factor in a member of the plurality of forward iterative steps based on a difference between the reference data set and the test data set; and selectively updating the reference data set based, at least in part, on the correction factor, where the correction factor facilitates resolving the difference between the reference data set and the test data set;

until a termination condition has been satisfied.

7. The method of claim 6, where creating the test data set includes performing a conjugate gradient (CG) reconstruction process.

8. The method of claim 6, where creating the test data set includes performing a steepest descent (SD) reconstruction process.

9. The method of claim 6, the reference data set being one of, a set of signal sets received from a set of receivers and combined into a single set of signals, and a set of signals received from a set of receivers and kept separately on a per receiver basis.

10. The method of claim 6, the reference data set being collected from one of, a computed tomography (CT) apparatus, a positron emission tomography (PET) apparatus, and a single photon emission computed tomography (SPECT) apparatus.

11. The method of claim 6, where the termination condition is related to one or more of, the difference being less than a pre-determined threshold, and having performed a pre-determined number of iterations.

* * * * *

UNITED STATES PATENT AND TRADEMARK OFFICE
CERTIFICATE OF CORRECTION

PATENT NO. : 7,558,414 B2  
APPLICATION NO. : 11/519105  
DATED : July 7, 2009  
INVENTOR(S) : Mark A. Griswold Page 1 of 1

It is certified that error appears in the above-identified patent and that said Letters Patent is hereby corrected as shown below:

Drawings:

Figure 5 reference number for Data box, delete "51/7" and insert --516--.

Background:

In column 2, line 32, delete "z=0" and insert --x=0--.

Detailed Description:

In column 5, line 13, delete "herd" and insert --hard--.

In column 6, line 5, delete "massively parallel" and insert --massively parallel,--.

In column 8, line 38, delete "signal" and insert --signals--.

Signed and Sealed this

Sixth Day of October, 2009

David J. Kappos
*Director of the United States Patent and Trademark Office*